(12) United States Patent
Shah

(10) Patent No.: US 8,120,162 B2
(45) Date of Patent: Feb. 21, 2012

(54) PACKAGE WITH IMPROVED CONNECTION OF A DECOUPLING CAPACITOR

(75) Inventor: Jitesh Shah, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 804 days.

(21) Appl. No.: 11/904,752

(22) Filed: Sep. 28, 2007

(65) Prior Publication Data

US 2009/0085158 A1 Apr. 2, 2009

(51) Int. Cl.
*H01L 29/00* (2006.01)
(52) U.S. Cl. .............. 257/690; 257/691; 257/E23.013; 257/E23.004; 257/E23.067
(58) Field of Classification Search ......... 257/690–691, 257/E23.013, E23.004, E23.067
See application file for complete search history.

(56) References Cited

U.S. PATENT DOCUMENTS

| | | | |
|---|---|---|---|
| 5,844,168 A | 12/1998 | Schueller et al. | |
| 6,207,476 B1 | 3/2001 | Zhao et al. | |
| 6,430,059 B1 | 8/2002 | Hung et al. | |
| 6,479,758 B1 | 11/2002 | Arima et al. | |
| 7,317,622 B2 * | 1/2008 | Li | 361/782 |
| 7,319,269 B2 | 1/2008 | Osburn | |
| 2004/0188856 A1 | 9/2004 | Hsu | |
| 2005/0017345 A1 * | 1/2005 | Sathe | 257/700 |
| 2006/0103004 A1 * | 5/2006 | Sakai et al. | 257/700 |

OTHER PUBLICATIONS

U.S. Appl. No. 11/590,940, filed Nov. 1, 2006, Jitesh Shah.
U.S. Appl. No. 11/540,068, filed Sep. 29, 2006, Jitesh Shah
The product described in the background of this application and illustrated in Fig. 1A and Fig. 1B of this application is prior art.
AVX online® Catalogs, AVX Catalog pp. 55, 63, 78, 80, 82, 84, 86, 88, 90, 92. AVX May 9, 2007,The applicant admits that this is prior art. http://www.avx.com/prodinfo_cataloglisting.asp.
Howard Johnson, "Spread Your Returns", by Howard Johnson, PhD, Electronic Design News, Mar. 31, 2005, EDN, http://www.edn.com.

* cited by examiner

*Primary Examiner* — Cuong Q Nguyen
*Assistant Examiner* — Tran Tran
(74) *Attorney, Agent, or Firm* — Roeder & Broder LLP

(57) ABSTRACT

A package (216) for electrically connecting an integrated circuit (212) to a printed circuit board (214) includes a mount array (219) and a substrate body (216A). The mount array (219) is electrically connected to the integrated circuit (212). The mount array (219) includes a plurality of positive terminal mounts (342), a plurality of negative terminal mounts (344), and a plurality of signal mounts (346). The substrate body (216A) includes a first conductive layer (220*a*), a second conductive layer (220*b*), and an insulating layer (222*a*) that is positioned between the first conductive layer (220*a*) and the second conductive layer (220*b*). The first conductive layer (220*a*) includes (i) a terminal portion (350) that is connected one of the terminal mounts (342) (344), and (ii) a signal portion (352) that is connected to the signal mounts (346). Further, the second conductive layer (220*b*) is directly connected to the other of the terminal mounts (344) (342). Additionally, the package (216) can include a capacitor (238) having a positive capacitor pad (556) and a negative capacitor pad (554). The electrical path of the capacitor (238) to the mount array (219) in the designs provided herein is relatively short, has relatively low impedance, and has a relatively low loop inductance.

20 Claims, 7 Drawing Sheets

PACKAGE WITH IMPROVED CONNECTION OF A DECOUPLING CAPACITOR

BACKGROUND

It is well known that integrated circuits (also referred to as "chips") are coupled to a printed circuit board via a package. FIG. 1A is a simplified side view of a prior art integrated circuit 12P and a prior art, four layer package 16P. In this embodiment, the package 16P includes a top bump array 19P having a plurality of bumps that electrically and mechanically attach the chip 12P to the top of the package 16P. FIG. 1B is a simplified view of a prior art bump array 19P. In this embodiment, the bump array 19P includes (i) a plurality of positive terminal bumps 42P (labeled with "+") and a plurality of negative terminal bumps 44P (labeled with "−") that are located near the center of the bump array 19P, and (ii) a plurality of signal bumps 46P (labeled with "s") that are positioned around an outer periphery of the bump array 19P.

Additionally, referring back to FIG. 1A, the package 16P can include one or more decoupling capacitors 38P that are placed on the top of the package 16P, and a plurality of conductive layers 20P that are separated by insulating layers 22P. The decoupling capacitors 38P help stabilize the voltage delivered to the integrated circuit 12P. For example, when there is a sudden change in the current drawn by the integrated circuit 12P, the decoupling capacitors 38P provide a local source of charge so that the current can be supplied quickly without allowing the voltage across the positive and negative terminals to dip suddenly.

Each of the decoupling capacitors 38P includes a positive capacitor pad and a negative capacitor pad. In one design, (i) a top, first conductive layer 20AP is electrically connected to the signal bumps 46P, (ii) a second conductive layer 20BP (that is positioned below the first conductive layer 20AP) is connected to the negative terminal bumps 44P and the negative capacitor pad with one or more vias, (iii) a third conductive layer 20CP (that is positioned below the second conductive layer 20BP) is connected to the positive capacitor pad and the signal power 42P, and (iv) a fourth conductive layer 20DP (that is positioned below the third conductive layer 20CP) is connected to a pinout 16BP.

Unfortunately, with this arrangement, an electrical path 15P (illustrated with thick dashed line) of the capacitors 38P to the terminal bumps 42P, 44P is relatively long, has relatively high impedance, and has a relatively high loop inductance. As a result thereof, the capacitors 38P may not effectively provide power to the terminal bumps 42P, 44P. Stated in another fashion, the inadequate decoupling of the capacitors 38P leads to excessive power supply noise. This can adversely influence signal integrity, cause EMC problems, and ultimately adversely influencing the reliability of the product.

SUMMARY

The present invention is directed to package for electrically connecting an integrated circuit to a printed circuit board. The package includes a mount array and a substrate body. The mount array is electrically connected to the integrated circuit. The mount array includes a plurality of positive terminal mounts, a plurality of negative terminal mounts, and a plurality of signal mounts. The substrate body includes a first conductive layer, a second conductive layer, and an insulating layer that is positioned between the first conductive layer and the second conductive layer. The first conductive layer includes (i) a terminal portion that is connected one of the terminal mounts, and (ii) a signal portion that is connected to the signal mounts. Further, the second conductive layer is directly connected to the other of the terminal mounts. Additionally, the package can include a capacitor having a positive capacitor pad and a negative capacitor pad.

In certain embodiments, with the mount array and conductive layer designs provided herein, the electrical path of the capacitor to the mount array is relatively short, has relatively low impedance, and has a relatively low loop inductance. As a result thereof, the capacitor is able to effectively stabilize the voltage delivered to the integrated circuit.

In one embodiment, the terminal portion of the first conductive layer can be connected to the positive terminal mounts, and the second conductive layer can be directly connected to the negative terminal mounts. Moreover, in this design, the positive capacitor pad can be electrically connected to the terminal portion of the first conductive layer, and the negative capacitor pad is electrically connected to the second conductive layer.

Alternatively, the terminal portion can be connected to the negative terminal mount, and the second conductive layer can be connected to the positive terminal mount. Further, in this embodiment, the negative capacitor pad can be electrically connected to the terminal portion of the first conductive layer, and the positive capacitor pad can be electrically connected to the second conductive layer.

In certain embodiments, the mount array includes an outer periphery, and one of the terminal mounts extend to the outer periphery of the mount array. For example, the positive terminal mounts or the negative terminal mounts can extend to the outer periphery of the mount array.

The present invention is also directed to a method for electrically connecting an integrated circuit to a printed circuit board.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
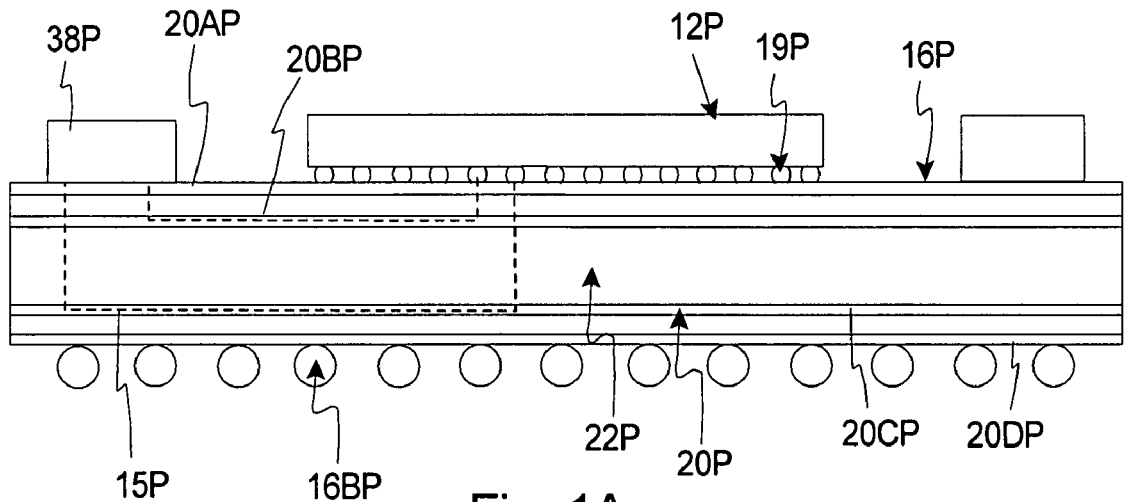
FIG. 1A is a simplified side view of a prior art integrated circuit and a prior art, four layer package.
Figure 1B:
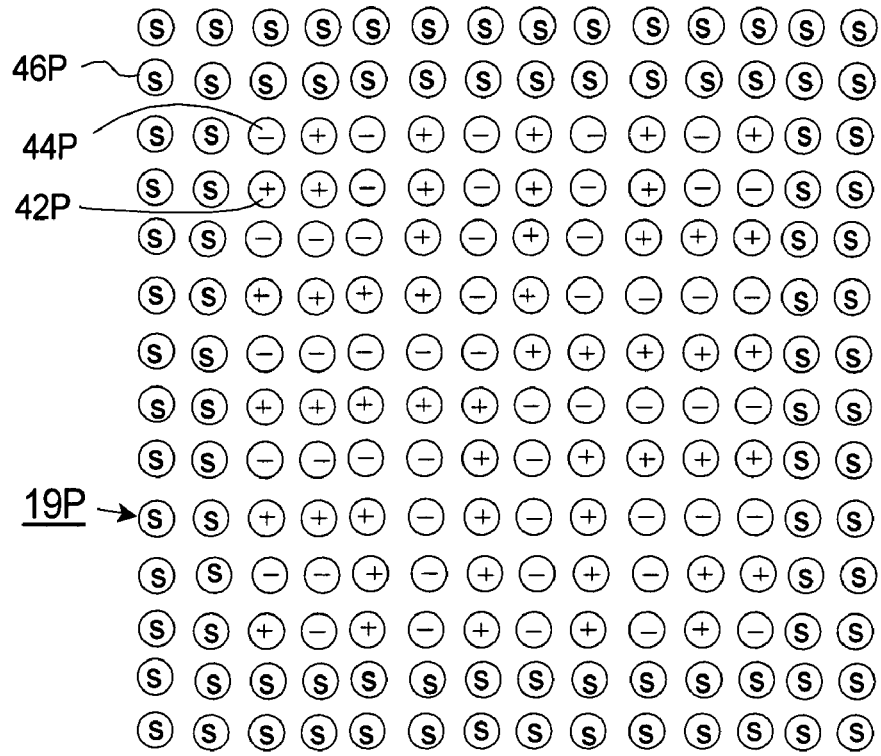
FIG. 1B is a simplified view of a prior art bump array.
Figure 2A:
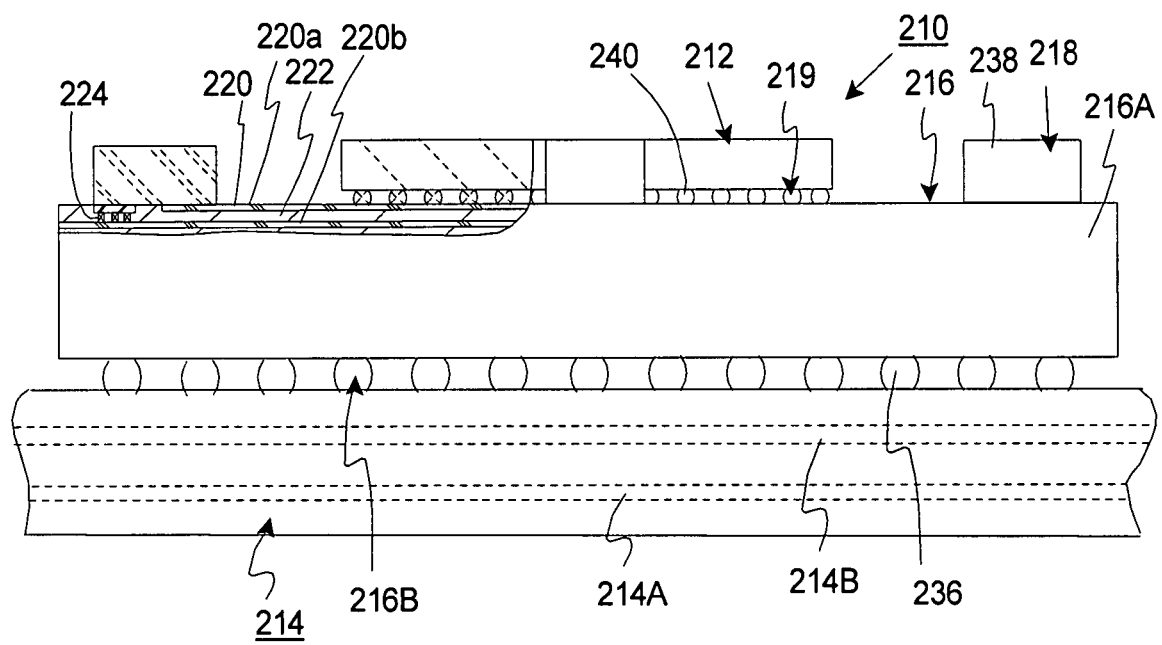
FIG. 2A is a simplified side view, in partial cut-away, of a digital system including a package having features of the present invention.

FIG. 2A is a simplified side view, in partial cut-away, of a portion of a digital system 210 that includes an integrated circuit 212 ("chip"), a printed circuit board 214, and a package 216 that attaches and electrically connects the integrated circuit 212 to the printed circuit board 214. The design of each of these components can be varied pursuant to the teachings provided herein.

As an overview, the package 216 includes a capacitor assembly 218, a unique mount array 219 for coupling the integrated circuit 212 to the package 216, and one or more uniquely designed patterned conductive layers 220. In certain embodiments, with the design of the mount array 219 and the conductive layers 220 provided herein, the electrical path of the capacitor assembly 218 to the mount array 219 is relatively short, has relatively low impedance, and has a relatively low loop inductance. As a result thereof, the capacitor assembly 218 is able to effectively stabilize the voltage delivered to the integrated circuit 212. For example, when there is a sudden change in the current drawn by the integrated circuit 212, the capacitor assembly 218 is able to quickly provide a local source of charge so that the current can be supplied without causing the voltage across the power and ground nodes to dip suddenly.

The integrated circuit 212 consists of a number of circuit elements positioned on a chip of silicon crystal or other semiconductor material. The design of the integrated circuit 212 can vary. For example, the integrated circuit 212 can be a flip type chip as illustrated in FIG. 2A. In this embodiment, the integrated circuit 212 is positioned on top of the package 216 and is electrically and mechanically directly connected to the package 216 with the mount array 219.

The printed circuit board 214 includes a flat board that is made of non-conducting material and a plurality of predefined conductive metal pathways that are printed on the surface of the board. In one embodiment, the printed circuit board 214 also includes power rail 214A (illustrated in phantom) and a ground rail 214B (illustrated in phantom).

The package 216 electrically and mechanically connects the integrated circuit 212 to the printed circuit board 214. For example, in FIG. 2A, the package 216 is designed to electrically connect a flip type chip 212 to the printed circuit board 214. The package 216 includes a substrate body 216A, a pinout 216B, the capacitor assembly 218, and the mount array 219.

The substrate body 216A routes all the functions of the chip 212. In one embodiment, the substrate body 216A includes a plurality of the patterned conductive layers 220 (only two are shown in FIG. 2A), a plurality of insulating layers 222 (only two are shown in FIG. 2A), and a plurality of vias 224 (only three are shown in FIG. 2A). The number and design of the layers 220, 222 in the substrate body 216A can be varied to achieve the design requirements of the digital system 210.

Figure 2B:
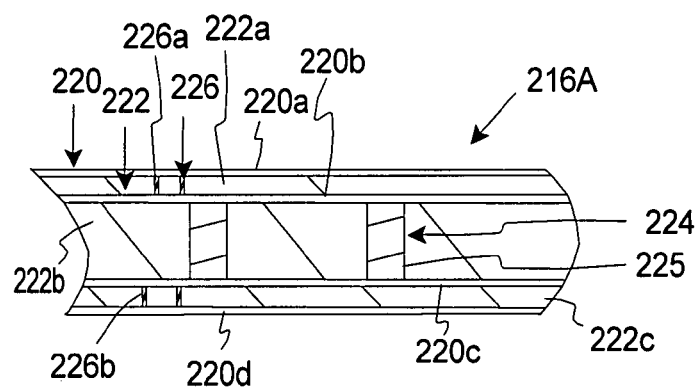
FIG. 2B is a cut-away view of a portion of the package of FIG. 2A.

FIG. 2B is an enlarged, simplified cut-away view of a portion of one, non-exclusive embodiment of the substrate body 216A. In this embodiment, the substrate body 216A includes the plurality of spaced apart patterned conductive layers 220, the plurality of spaced apart insulating layers 222, and the plurality of vias 224 (only a few are illustrated in FIG. 2B). The design and number of each of these components can be varied to achieve the design requirements of the package substrate 216 (illustrated in FIG. 2A).

In this embodiment, the substrate body 216A includes four spaced apart patterned conductive layers 220. These conductive layers 220 can be labeled from top to bottom as an upper, first conductive layer 220a (adjacent to the integrated circuit 212 and the capacitor assembly 218), a second conductive layer 220b that is positioned below the first conductive layer 220a, a third conductive layer 220c that is positioned below the second conductive layer 220b, and a fourth conductive layer 220d that is positioned below the third conductive layer 220c. Alternatively, the package substrate 216 could be designed to have more than four or fewer than four spaced apart patterned conductive layers 220. The conductive material used in the conductive layers 220 can vary. A suitable conductive material is copper.

The first conductive layer 220a can include a plurality of mount pads (not shown) that are used to electrically and mechanically connect to the mount array 219 (illustrated in FIG. 2A). Somewhat similarly, the fourth conductive layer 220d can include a plurality of mount pads (not shown) that are used to electrically and mechanically connect the substrate body 216A to the pinouts 216B (illustrated in FIG. 2A).

As discussed in more detail below, the first conductive layer 220a is uniquely design to provide an improved connection of the capacitor assembly 218 to the mount array 219.

It should be noted that the use of the terms "first", "second", "third", etc., with regard to the conductive layers is for the sake of convenience and ease in understanding the invention only and are not intended to be limiting in any manner. In other words, any of the conductive layers 220 can be the "first conductive layer", the "second conductive layer", or the "third conductive layer", etc.

The insulating layers 222 mechanically and electrically separate the conductive layers 220. The number of insulating layers 222 will depend upon the number of conductive layers 220. In FIG. 2B, the insulating layers 222 can be labeled from top to bottom as the first insulating layer 222a, the second insulating layer 222b (also referred to as the "core layer"), and the third insulating layer 222c. In this embodiment, (i) the first insulating layer 222a separates and isolates the first and second conductive layers 220a, 220b, (ii) the core, second insulating layer 222b separates and isolates the second and third conductive layers 220b, 220c, and (iii) the third insulating layer 222c separates and isolates the third and fourth conductive layers 220c, 220d.

The insulating material used in the insulating layers 222 can vary. Suitable materials for the insulating material include dielectrics, such as glass epoxy.

It should be noted that the use of the terms "first", "second", "third", etc., with regard to the insulating layers is for the sake of convenience and ease in understanding the invention only and are not intended to be limiting in any manner. In other words, any of the insulating layers 220 can be the "first insulating layer", the "second insulating layer", or the "third insulating layer", etc.

The vias 224 are formed in the insulating layers 222 and can electrically connect any two patterned conductive layers 220. Two types of vias 224 are illustrated in FIG. 2B, namely core vias 225 and micro-vias 226.

The plurality of core vias 225 are electrically conductive paths that extend through the core layer 222b. The number and location of the core vias 225 can vary. In FIG. 2B, only two core vias 225 are illustrated. Suitable conductive material for the core vias 225 include copper.

The plurality of micro-vias 226 are electrically conductive paths that extend through one or more of the insulating layers 222 and that electrically connect the two conductive layers 220. The number and location of the micro-vias 226 can vary. In FIG. 2B, (i) two first micro-vias 226a that extend through the first insulating layer 222a are illustrated, and (ii) two second micro-vias 226b that extend through the third insulating layer 222c are illustrated. Suitable conductive materials for the micro-vias 226 include copper.

Referring back to FIG. 2A, the pinout 216B electrically and mechanically connects the substrate body 216A to the printed circuit board 214. In one non-exclusive example, the pinout 216B can include a ball grid array (BGA) that electrically and mechanically couples the package 216 to the printed circuit board 214. For example, the pinout 216B can include a plurality of pins 236. In one non-exclusive embodiment, the pins 236 are solder balls. Further, the pins 236 can include negative pins, positive pins and/or signal pins. These pins 236 can be strategically arranged to reduce crosstalk and/or to improve signal timing margins.

The capacitor assembly 218 stabilizes the voltage delivered to the integrated circuit 212. For example, when there is a sudden change in the current drawn by the integrated circuit 212 during large switching events, the capacitor assembly 218 provides a local source of charge so that the current can be supplied quickly without causing the voltage across the power and ground nodes to dip suddenly. The design of the capacitor assembly 218 can vary pursuant to the teachings provided herein. In FIG. 2A, the capacitor assembly 218 includes four spaced apart, generally rectangular shaped decoupling capacitors 238 (only three are visible in FIG. 2A) that are secured to the top of the substrate body 216A around the integrated circuit 212, and adjacent to the first conductive layer 220a. Alternatively, the capacitor assembly 218 can include more than four or fewer than four capacitors 238, and/or the shape or arrangement of the capacitors 238 can be different than that illustrated in FIG. 2A.

Each of the decoupling capacitors 238 are electrically connected to the first conductive layer 222a and the second conductive layer 222b. With this design, the electrical path of the capacitors 238 to the mount array 219 is relatively short, has relatively low impedance, and has a relatively low loop inductance. As a result thereof, the capacitors 238 can supply adequate power during very high frequency current transients.

Figure 2C:
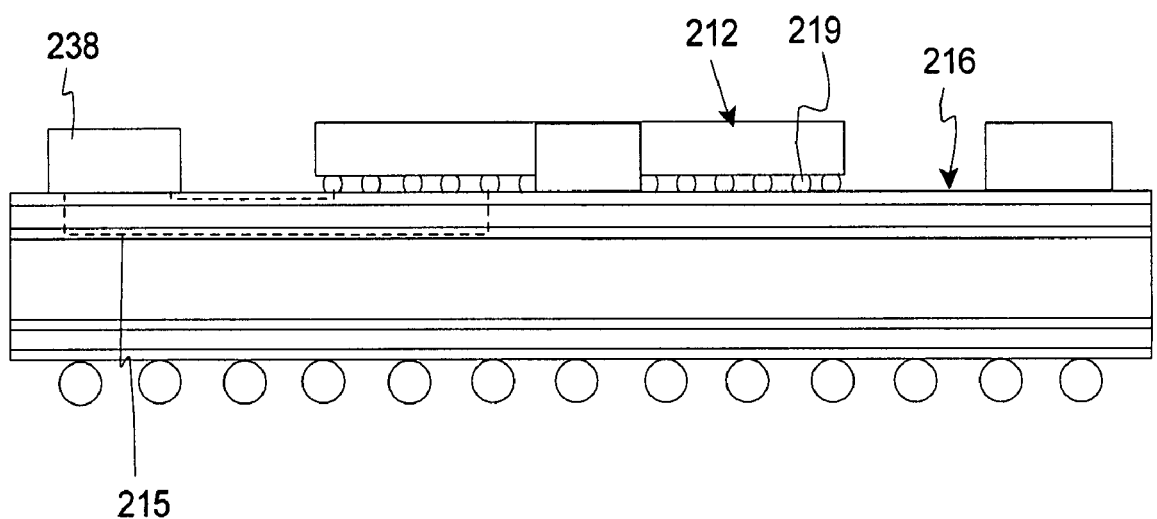
FIG. 2C is a simplified side view of a portion of the digital system of FIG. 2A.

FIG. 2C is a simplified side view of the integrated circuit 212 and the four layer package 216. FIG. 2C also illustrates an electrical path 215 (illustrated with thick dashed line) of the capacitors 238 to the mount array 219 is relatively short.

Referring back to FIG. 2A, in one embodiment, each of the discrete capacitors 238 is a premade, low inductance capacitor. For example, suitable capacitors include surface mounted, low inductance capacitors sold by AVX, having a sales office in Santa Clara, Calif.

The mount array 219 electrically and mechanically connects the integrated circuit 212 to the package 216. The design of the mount array 219 can vary pursuant to the teachings provided herein. In FIG. 2A, the mount array 219 is positioned on top of and adjacent to the first conductive layer 220a. Further, the mount array 219 includes a plurality of spaced apart bumps 240 (e.g. solder balls) that electrically connect the integrated circuit 212 to the package 216.

Figure 3:
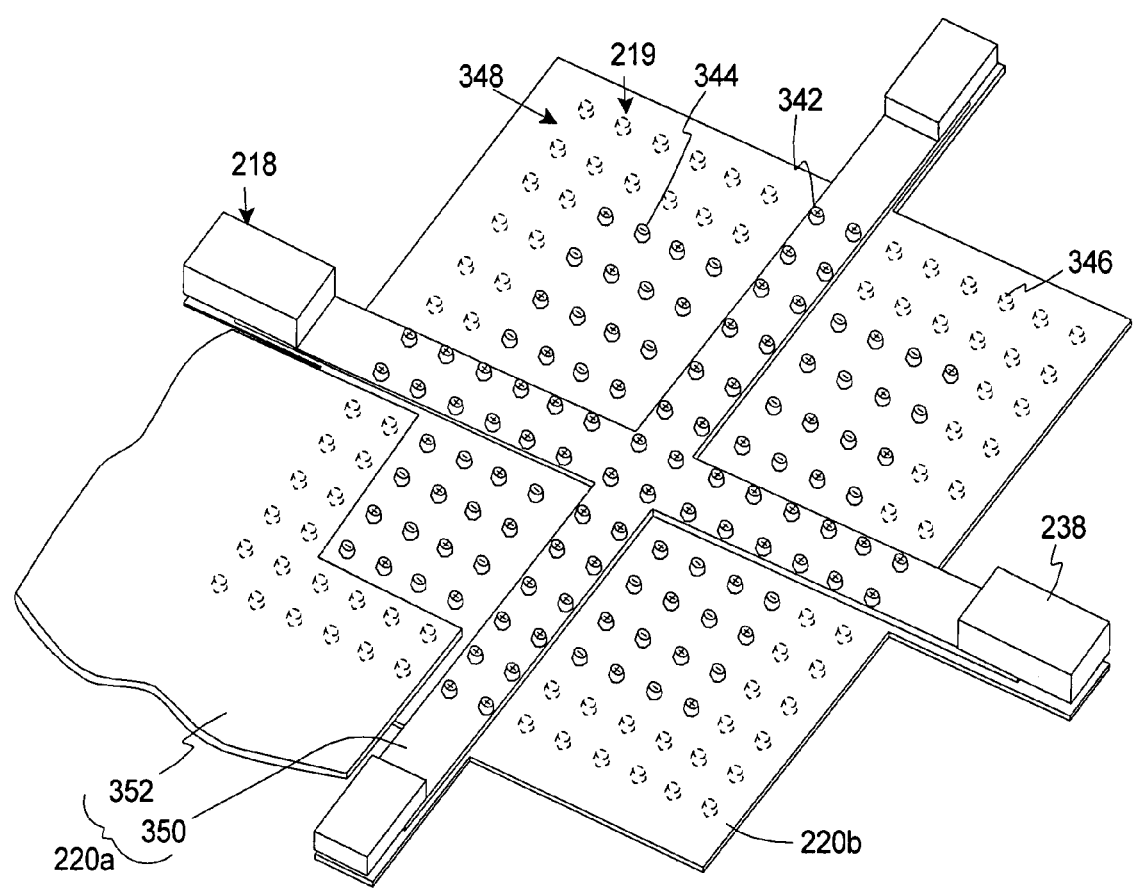
FIG. 3 is a simplified perspective view, in partial cut-away of a portion of the package of FIG. 2A.

FIG. 3 is a simplified perspective view of one non-exclusive embodiment of the mount array 219, the first conductive layer 220a (in partial cut-away), the second conductive layer 220b, and the capacitor assembly 218. Further, FIG. 4 illustrates a top view of the mount array 219, a portion of the first conductive layer 220a, the second conductive layer 220b, and the capacitor assembly 218 that is connected in parallel to the conductive layers 220a, 220b.

Figure 4:
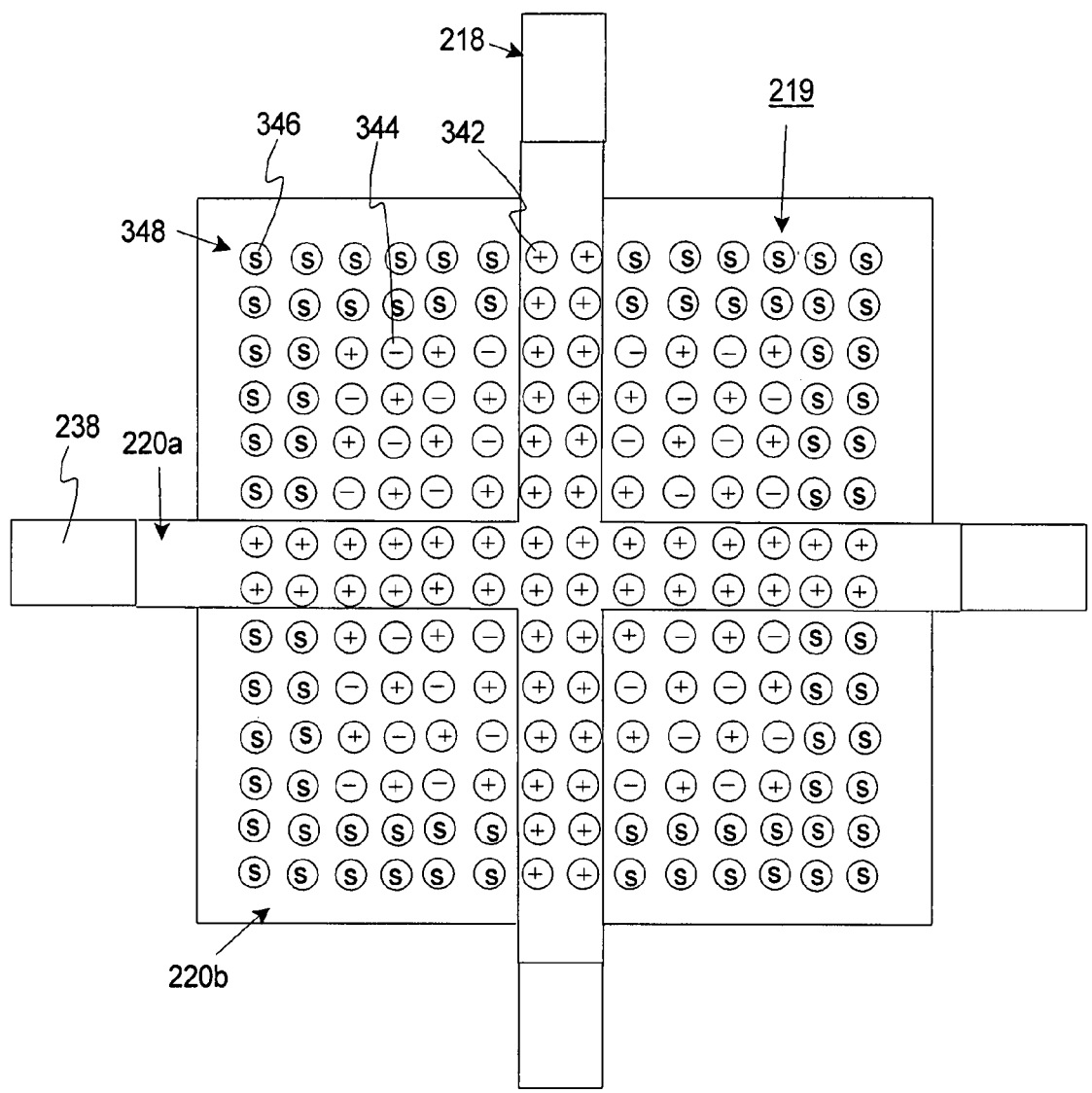
FIG. 4 is a simplified top view of a portion of the package of FIG. 2A.

In the embodiment illustrated in FIGS. 3 and 4, the mount array 219 includes a plurality of positive terminal mounts 342 (labeled with "+"), a plurality of negative terminal mounts 344 (labeled with "−"), and a plurality of signal mounts 346 (illustrated with dashed lines in FIG. 3 and "s" in FIG. 4). The positive terminal mounts 342 and the negative terminal mounts 344 cooperate to connect power to the integrated circuit 212 (illustrated in FIG. 2A), while the signal mounts 346 connect to the integrated circuit 212 and allow for signals to be transferred between the integrated circuit 212 and the package 216.

The number and arrangement of the mounts 342, 344, 346 can be varied pursuant to the teachings provided herein to achieve the desired capacitor assembly 218 connections and the performance of the integrated circuit 212. In FIGS. 3 and 4, the mount array 219 is generally rectangular shaped and the mounts 342, 344, 346 are substantially equidistant from each other. Further, in this embodiment, (i) the positive terminal mounts 342 form a "+" that extends across the entire mount array 219 to a periphery 348 of the mount array 219, (ii) the signal mounts 346 partly surround the periphery 348, and (iii) the positive terminal mounts 342 and the negative terminal mounts 344 are alternately interspersed in the remaining part (in the middle) of the mount array 219. Alternatively, the mount array 219 can have a configuration different from that illustrated in FIGS. 3 and 4, and/or the mounts 342, 344, 346 can have a configuration different from that illustrated in FIGS. 3 and 4.

Additionally, as illustrated in FIG. 3, the first conductive layer 220a is a multi-part layer that includes (i) a terminal portion 350 that is connected to some of the positive terminal mounts 342, and (ii) a signal portion 352 (only a portion is illustrated in FIG. 3) that is connected to the signal mounts 346. Further, these portions 350, 352 are coplanar.

The size and shape of each portion 350, 352 can be varied to achieve the connection requirements of the first conductive layer 220a. In FIGS. 3 and 4, the terminal portion 350 is generally "+" plate shaped and extends between the capacitors 38. Alternatively, the terminal portion 350 can have a different configuration if the capacitors 238 are located in a different orientation. For example, the terminal portion can be "X" plate shaped.

Further, the signal portion 352 can take up a portion of the area that is not occupied by the terminal portion 350. In FIG. 3, the signal portion 352 includes four (only one is shown in FIG. 3) somewhat plate shaped areas that are separated by the terminal portion 350. In this embodiment, the signal mounts 346 are directly attached to the signal portion 352 of the first conductive layer 220a.

The second conductive layer 220b is positioned below the first conductive layer 220a and is connected to the negative terminal mounts 344 with vias (not shown in FIGS. 3 and 4).

Figure 5:
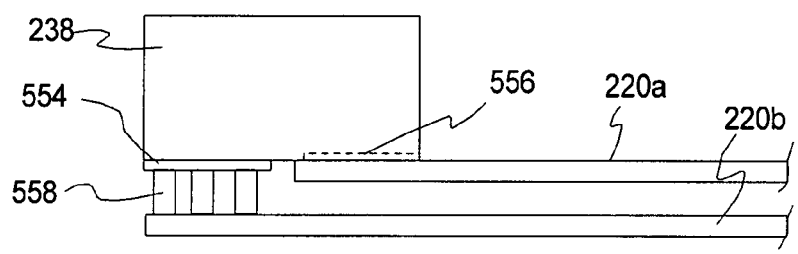
FIG. 5 is a simplified side view of a portion of the package of FIG. 2A.

FIG. 5 is a simplified side view of one of the capacitors 238, a portion of the first conductive layer 220a, and a portion of the second conductive layer 220b. FIG. 5 illustrates that the capacitor 238 includes a negative capacitor pad 554 and a positive capacitor pad 556 (illustrated in phantom). In this embodiment, the negative capacitor pad 554 is attached to the second conductive layer 220b with three vias 558 and the positive capacitor pad 556 is directly attached to the first conductive layer 220a.

Referring to FIGS. 3-5, because of this arrangement, the electrical path of the capacitors 238 to the mount array 219 is relatively short, wide, has a relatively small loop area, has relatively low impedance, and has a relatively low loop inductance. Further, there is a direct connection to the capacitors 238 and the terminal mounts 342, 344. The ability for the integrated circuit 212 to access the charge stored in these capacitors 238 depends on the impedance offered by the interconnect path to these capacitors. The impedance path provided herein is relatively short and is useful to supply charge during very high frequency current transients.

Moreover, because the signals and one of the terminals share the same conductive layer 220a, the overall number of conductive layers in the package 216 is reduced. Stated in another fashion, the ability of the capacitors 238 to deliver power to the integrated circuit 212 is accomplished while using the least layer count package 216 possible.

Figure 6:
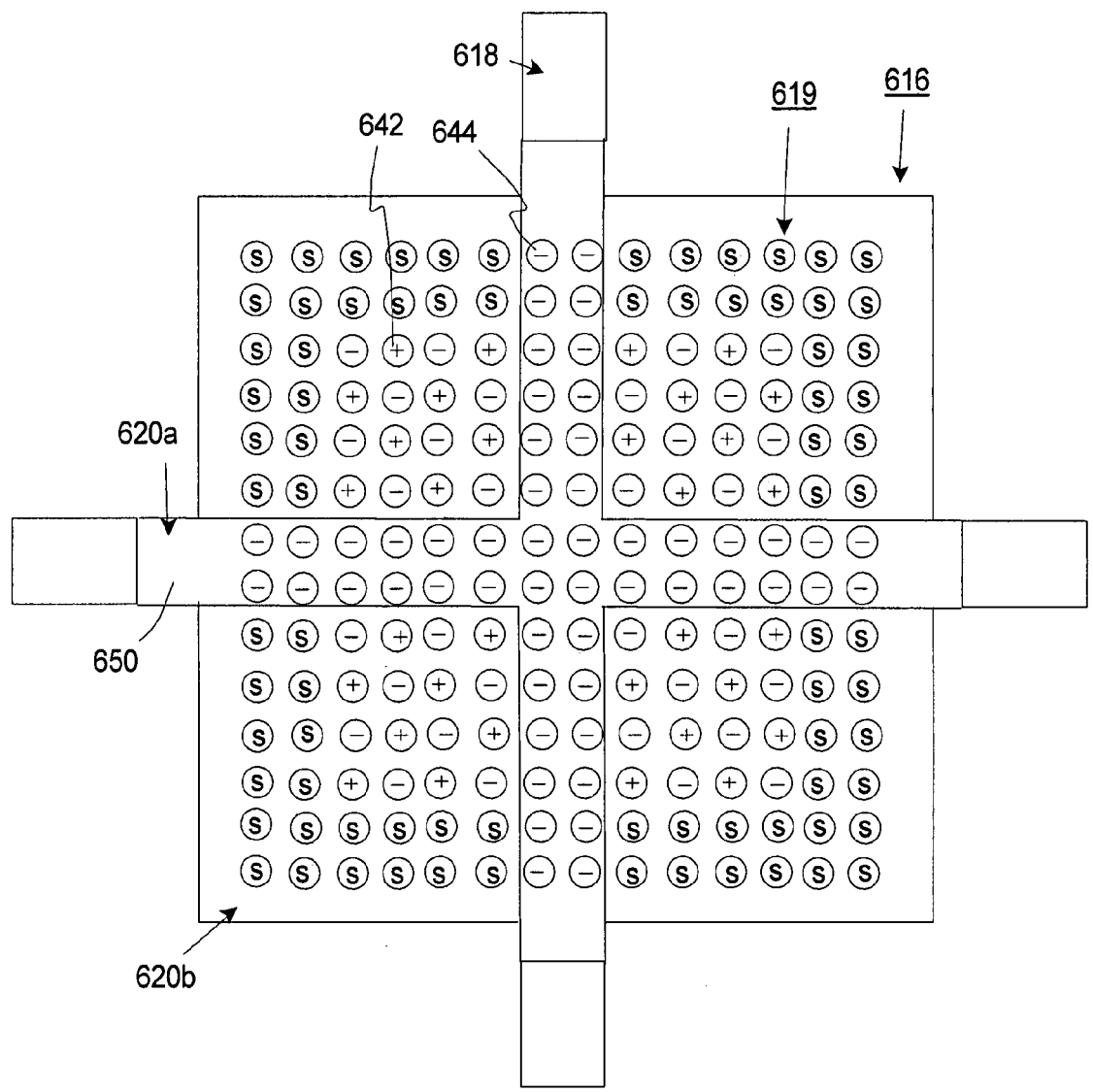
FIG. 6 is a simplified top view of a portion of another embodiment of the package.

FIG. 6 is a simplified top view of a portion of another embodiment of the package 616. More specifically, FIG. 6 illustrates the mount array 619, a portion of the first conductive layer 620a, the second conductive layer 620b, and the conductor assembly 618. In this embodiment, the mount array 619 and the conductive layers 620a, 620b are somewhat similar to the corresponding components described above. However, in this embodiment, the terminal portion 650 of the first conductive layer 620a is connected to the negative terminal mounts 644.

Further, the second conductive layer 620b is connected to the positive terminal mounts 642 with vias (not shown in FIG. 6).

Figure 7:
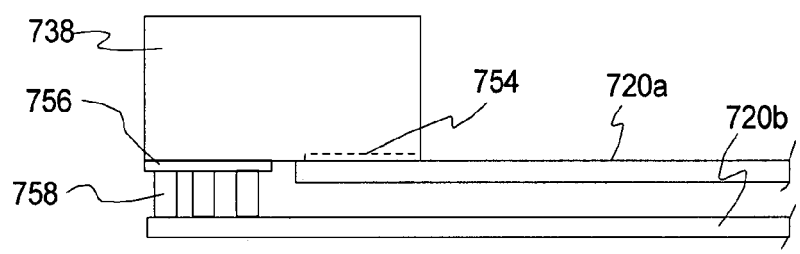
FIG. 7 is a simplified side view of a portion of the package of FIG. 5.

FIG. 7 is a simplified side view of one of the capacitors 738, a portion of the first conductive layer 620a, and a portion of the second conductive layer 620b. In this embodiment, the negative capacitor pad 754 (illustrated in phantom) is directly attached to the first conductive layer 620b, and the positive capacitor pad 756 is attached to the first conductive layer 620a with three vias 758.

Because of this arrangement, the electrical path of the capacitors 738 to the mount array 619 is relatively short, wide, has a relatively small loop area, has relatively low impedance, and has a relatively low loop inductance.

Figure 8:
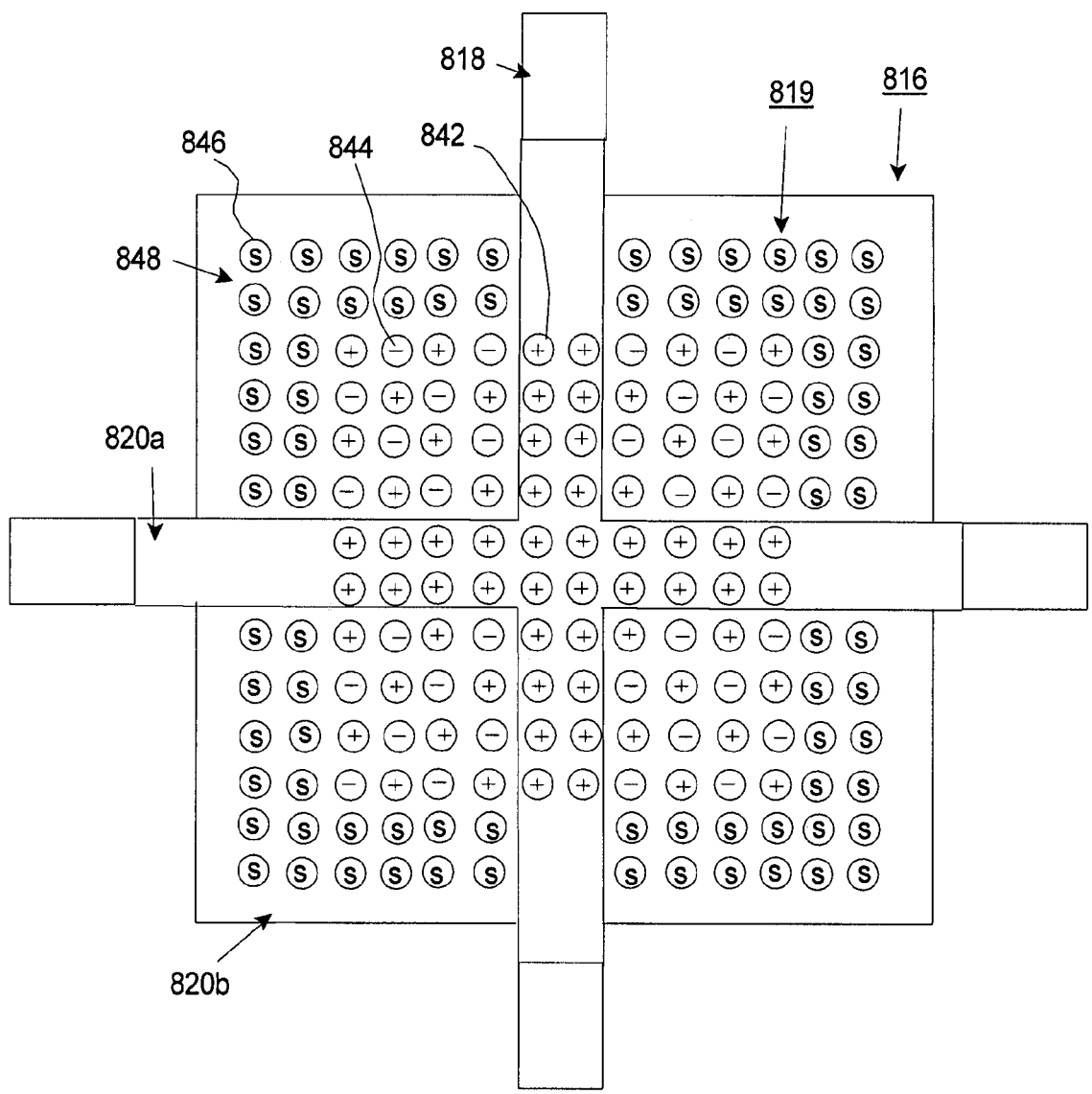
FIG. 8 is a simplified top view of a portion of yet another embodiment of the package.

FIG. 8 is a simplified top view of a portion of yet another embodiment of the package 816. FIG. 8 illustrates a portion of mount array 819, the first conductive layer 820a, the second conductive layer 820b, and the conductor assembly 818. In this embodiment, the mount array 819 and the conductive layers 820a, 820b are somewhat similar to the corresponding components described above. However, in this embodiment, the positive terminal mounts 842 do not extend to the periphery 848 of the mount array 819.

Thus, the terminal mounts 842, 844 do not necessarily need to extend to the edge of the mount array 819 as long as there is sufficient gap in between the signal mounts 846 for a direct connection to terminal mounts 842, 844.

While the particular designs as herein shown and disclosed in detail are fully capable of obtaining the objects and providing the advantages herein before stated, it is to be understood that they are merely illustrative of one or more embodiments and that no limitations are intended to the details of construction or design herein shown other than as described in the appended claims.

What is claimed is:

1. A package for electrically connecting an integrated circuit to a printed circuit board, the package comprising:
a mount array that is adapted to be electrically connected to the integrated circuit, the mount array having a center and an outer periphery, the mount array including a plurality of positive terminal mounts, a plurality of negative terminal mounts, and a plurality of signal mounts, wherein at least one row of same-charged terminal mounts extends from the center to the outer periphery of the mount array;
a substrate body that includes a first conductive layer, a second conductive layer, and an insulating layer that is positioned between the first conductive layer and the second conductive layer; the first conductive layer including a terminal portion that extends from adjacent the center of the mount array to adjacent the outer periphery of the mount array, the plurality of positive terminal mounts being connected to one of the terminal portion and the second conductive layer, and the plurality of negative terminal mounts being connected to the other of the terminal portion and the second conductive layer.

2. The package of claim 1 wherein the mount array includes two rows of same-charged terminal mounts that extend from the center to the outer periphery of the mount array.

3. The package of claim 1 wherein the mount array includes at least one row of positive terminal mounts that extends from the center to the outer periphery of the mount array.

4. The package of claim 1 wherein the mount array includes at least one row of negative terminal mounts that extends from the center to the outer periphery of the mount array.

5. The package of claim 1 further comprising a capacitor assembly including a capacitor having a positive capacitor pad and a negative capacitor pad; and wherein the terminal portion is connected to the positive terminal mounts and the positive capacitor pad, and wherein the second conductive layer is connected to the negative terminal mounts and the negative capacitor pad.

6. The package of claim 1 further comprising a capacitor assembly including a capacitor having a positive capacitor pad and a negative capacitor pad; and wherein the terminal portion is connected to the negative terminal mounts and the negative capacitor pad, and wherein the second conductive layer is connected to the positive terminal mounts and the positive capacitor pad.

7. The package of claim 1 further comprising a capacitor assembly that includes a plurality of spaced apart capacitors that are positioned adjacent to the first conductive layer, each of the plurality of capacitors having a positive capacitor pad and a negative capacitor pad; wherein one of the capacitor pads of each capacitor is electrically connected to the terminal portion of the first conductive layer; and wherein the other capacitor pad of each capacitor is electrically connected to the second conductive layer.

8. The package of claim 7 wherein the capacitor assembly includes four spaced apart capacitors, and wherein the terminal portion of the first conductive layer is generally "+" plate shaped and extends between the capacitors; and wherein the terminal portion is adjacent to the capacitor assembly.

9. A digital system comprising an integrated circuit, a printed circuit board, and the package of claim 1 that electrically and mechanically connects the integrated circuit to the printed circuit board.

10. A package for electrically connecting an integrated circuit to a printed circuit board, the package comprising:
a mount array that is adapted to be electrically connected to the integrated circuit, the mount array including a plurality of positive terminal mounts, a plurality of negative terminal mounts, and a plurality of signal mounts;
a capacitor assembly including a first capacitor having a positive first capacitor pad and a negative first capacitor pad; and
a substrate body that includes a first conductive layer positioned adjacent to the mount array and the first capacitor, a second conductive layer, and an insulating layer that is positioned between the first conductive layer and the second conductive layer; the first conductive layer including a terminal portion that is a unitary structure without apertures that extends from a center of the mount array to adjacent to the first capacitor, the plurality of positive terminal mounts and the positive first capacitor pad being connected to one of the terminal portion and the second conductive layer, and the plurality of negative terminal mounts and the negative first capacitor pad being connected to the other of the terminal portion and the second conductive layer.

11. The package of claim 10 wherein the terminal portion is connected to the positive terminal mounts and the positive first capacitor pad, and wherein the second conductive layer is connected to the negative terminal mounts and the negative first capacitor pad.

12. The package of claim 10 wherein the terminal portion is connected to the negative terminal mounts and the negative first capacitor pad, and wherein the second conductive layer is connected to the positive terminal mounts and the positive first capacitor pad.

13. The package of claim 10 wherein the capacitor assembly further includes a second capacitor positioned adjacent to the first conductive layer, the second capacitor being spaced apart from the first capacitor, the second capacitor having a positive second capacitor pad and a second negative capacitor pad; wherein one of the second capacitor pads is electrically connected to the terminal portion of the first conductive layer; and wherein the other second capacitor pad is electrically connected to the second conductive layer.

14. The package of claim 13 wherein the capacitor assembly further includes a third capacitor positioned adjacent to the first conductive layer, the third capacitor being spaced apart from the first capacitor and the second capacitor, the third capacitor having a third positive capacitor pad and a negative third capacitor pad; wherein one of the third capacitor pads is electrically connected to the terminal portion of the first conductive layer; and wherein the other third capacitor pad is electrically connected to the second conductive layer.

15. The package of claim 14 wherein the capacitor assembly further includes a fourth capacitor positioned adjacent to the first conductive layer, the fourth capacitor being spaced apart from the first capacitor the second capacitor and the third capacitor, the fourth capacitor having a fourth positive capacitor pad and a negative fourth capacitor pad; wherein one of the fourth capacitor pads is electrically connected to the terminal portion of the first conductive layer; and wherein the other fourth capacitor pad is electrically connected to the second conductive layer.

16. The package of claim 15 wherein the terminal portion of the first conductive layer is generally "+" plate shaped and extends between the capacitors.

17. A digital system comprising an integrated circuit, a printed circuit board, and the package of claim 10 that electrically and mechanically connects the integrated circuit to the printed circuit board.

18. A package for electrically connecting an integrated circuit to a printed circuit board, the package comprising:
a mount array that is adapted to be electrically connected to the integrated circuit, the mount array including a plurality of positive terminal mounts, a plurality of negative terminal mounts, and a plurality of signal mounts;
a capacitor assembly including a plurality of spaced apart capacitors, each of the plurality of capacitors having a positive capacitor pad and a negative capacitor pad; and
a substrate body that includes a first conductive layer positioned adjacent to the mount array and the plurality of capacitors, a second conductive layer, and an insulating layer that is positioned between the first conductive layer and the second conductive layer; the first conductive layer including a terminal portion that is generally "+" plate shaped, the plurality of positive terminal mounts and the positive capacitor pads of each capacitor being connected to one of the terminal portion and the second conductive layer, and the plurality of negative terminal mounts and the negative capacitor pads of each capacitor being connected to the other of the terminal portion and the second conductive layer.

19. The package of claim 18 wherein each of the plurality of capacitors is positioned adjacent to a separate end of the terminal portion of the first conductive layer.

20. A digital system comprising an integrated circuit, a printed circuit board, and the package of claim 18 that electrically and mechanically connects the integrated circuit to the printed circuit board.

* * * * *